US 9,209,149 B2

(12) United States Patent
Huang et al.

(10) Patent No.: US 9,209,149 B2
(45) Date of Patent: Dec. 8, 2015

(54) BUMP-ON-TRACE STRUCTURES WITH HIGH ASSEMBLY YIELD

(71) Applicant: Taiwan Semiconductor Manufacturing Company, Ltd., Hsin-Chu (TW)

(72) Inventors: Chih-Fan Huang, Kaoshung (TW); Yi-Teh Chou, Taipei (TW); Ming-Da Cheng, Jhubei (TW); Tin-Hao Kuo, Hsin-Chu (TW); Chung-Shi Liu, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 79 days.

(21) Appl. No.: 14/080,217

(22) Filed: Nov. 14, 2013

(65) Prior Publication Data

US 2015/0130051 A1     May 14, 2015

(51) Int. Cl.
| | | |
|---|---|---|
| *H01L 23/00* | (2006.01) | |
| *H01L 21/56* | (2006.01) | |
| *H01L 21/60* | (2006.01) | |
| *H01L 23/31* | (2006.01) | |

(52) U.S. Cl.
CPC .............. *H01L 24/17* (2013.01); *H01L 21/563* (2013.01); *H01L 23/562* (2013.01); *H01L 24/10* (2013.01); *H01L 24/11* (2013.01); *H01L 23/3114* (2013.01); *H01L 2021/60022* (2013.01); *H01L 2224/16013* (2013.01); *H01L 2924/18161* (2013.01)

(58) Field of Classification Search
CPC ..................... H01L 24/10; H01L 24/11; H01L 2224/16013; H01L 21/563; H01L 2021/60022; H01L 2225/06513; H01L 2924/18161
See application file for complete search history.

(56) References Cited

U.S. PATENT DOCUMENTS

| | | | |
|---|---|---|---|
| 6,548,330 B1 | 4/2003 | Murayama et al. | |
| 6,696,764 B2 | 2/2004 | Honda | |
| 6,933,173 B2 | 8/2005 | Yunus | |
| 7,041,531 B2 | 5/2006 | Wang | |
| 8,288,871 B1* | 10/2012 | Shieh et al. | 257/773 |
| 8,440,503 B1 | 5/2013 | Lin et al. | |
| 2002/0053745 A1 | 5/2002 | Lin | |
| 2005/0009237 A1 | 1/2005 | Yamaguchi | |
| 2010/0227170 A1 | 9/2010 | Endo et al. | |
| 2011/0248399 A1* | 10/2011 | Pendse | 257/737 |
| 2013/0026619 A1* | 1/2013 | Chang et al. | 257/737 |
| 2014/0291834 A1* | 10/2014 | Gandhi et al. | 257/737 |

OTHER PUBLICATIONS

Lee, Minjae et al., "Study of Interconnection Process for Fine Pitch Flip Chip," Electronic Components and Technology Conference, May 26-29, 2009, 4 pages.

* cited by examiner

*Primary Examiner* — Phat X Cao
(74) *Attorney, Agent, or Firm* — Slater & Matsil, L.L.P.

(57) ABSTRACT

A package includes first package component, which further includes a first metal trace at a surface of the first package component, with the first metal trace having a trace width measured in a direction perpendicular to a lengthwise direction of the first metal trace. The first package component further includes a second metal trace at the surface of the first package component. The first metal trace and the second metal trace are parallel to each other. A second package component is overlying the first package component, wherein the second package component includes a metal bump. A solder region bonds the metal bump to the first metal trace, wherein the solder region contacts a top surface and sidewalls of the first portion of the first metal trace. A ratio of a volume of the solder region to the trace width is between about 1,100 $\mu m^2$ and about 1,300 $\mu m^2$.

19 Claims, 5 Drawing Sheets

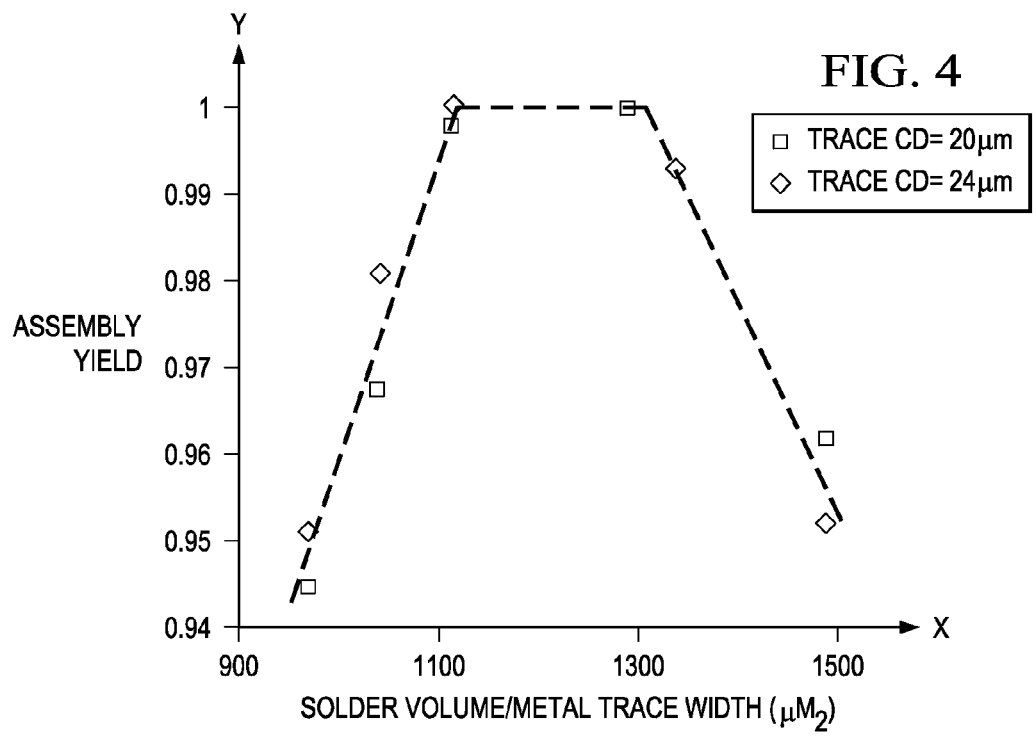
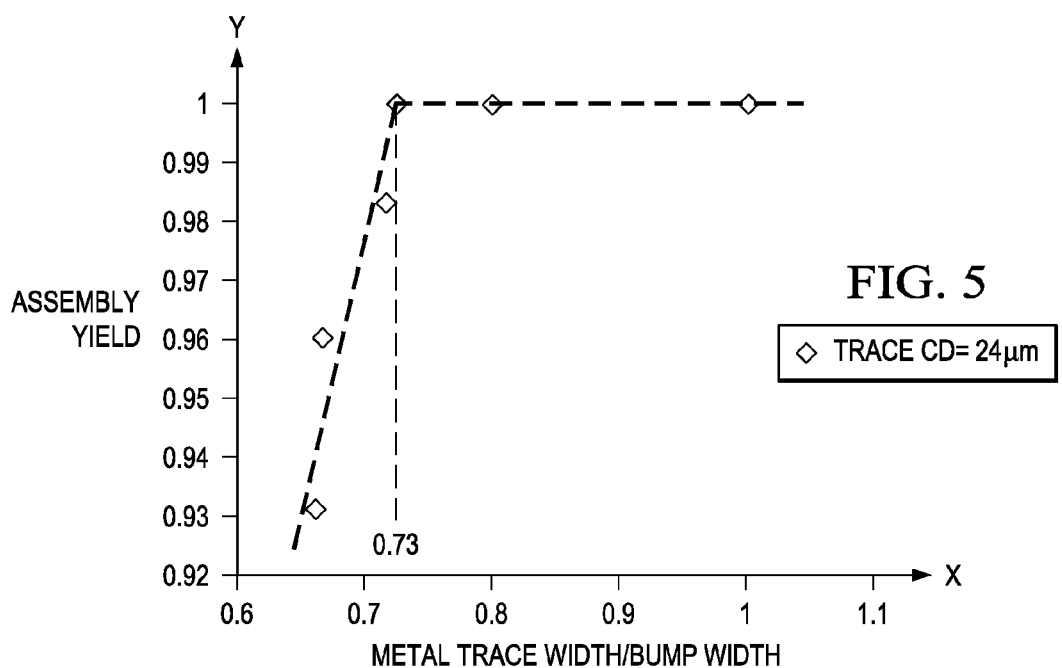

BUMP-ON-TRACE STRUCTURES WITH HIGH ASSEMBLY YIELD

BACKGROUND

Bump-on-Trace (BOT) structures are used in flip chip packages, wherein metal bumps are bonded onto narrow metal traces in package substrates directly, rather than bonded onto metal pads that have larger sizes than the respective connecting metal traces. The BOT structures require smaller chip areas, and the manufacturing cost of the BOT structures is low. The conventional BOT structures may achieve the same reliability as the conventional bond structures that are based on metal pads. In a typical BOT structure, a solder region is formed on a surface of a copper bump of a device die. The solder region bonds the copper bump to a metal trace in a package substrate. The solder region contacts a top surface and sidewalls of the metal trace, hence forming the BOT structure.

Since the existing BOT structures have very small spacings, bridging may occur, wherein the solder region of one BOT bond structure is bridged to a neighboring metal trace. Particularly, the BOT structures in the peripheral areas of the packages are more likely to bridge due to the high density of the BOT structures in the peripheral areas. In addition, in the peripheral areas, the distance of the BOT structures are farther away from the centers of the respective packages. Accordingly, during the reflow process for forming the BOT structures, the shift of the BOT structures caused by the thermal expansion of the metal traces is more significant than in the areas close to the centers of the respective packages. Accordingly, the bridging is more likely to occur.

Previously, to reduce the likelihood of the bridging in BOT structures, either narrow metal traces are used, or less solder is used. When the metal traces are narrowed to reduce the bridging, since the adhesion of the metal traces to the respective underlying dielectric layer is related to the contacting area between the metal traces and the dielectric layer, with the reduction in the metal traces, the contacting area is reduced, the adhesion between the metal traces and the dielectric layer degrades. As a result, metal traces are more likely to peel off from the dielectric layer. On the other hand, if less solder is used to reduce the bridging, the stress that occur to the solder region is applied on a small solder region, and solder crack is more likely to occur than on a larger solder region.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4 illustrates the assembly yield of various BOT structures as a function of ratios of solder volumes to the widths of the respective connecting metal traces;

FIG. 5 illustrates the assembly yield of various BOT structures as a function of ratios of the widths of metal traces to the widths of metal bumps.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Bump-on-Trace (BOT) bonding structure is provided in accordance with various exemplary embodiments. The variations of the embodiments are discussed. Throughout the various views and illustrative embodiments, like reference numbers are used to designate like elements.

Figure 1:
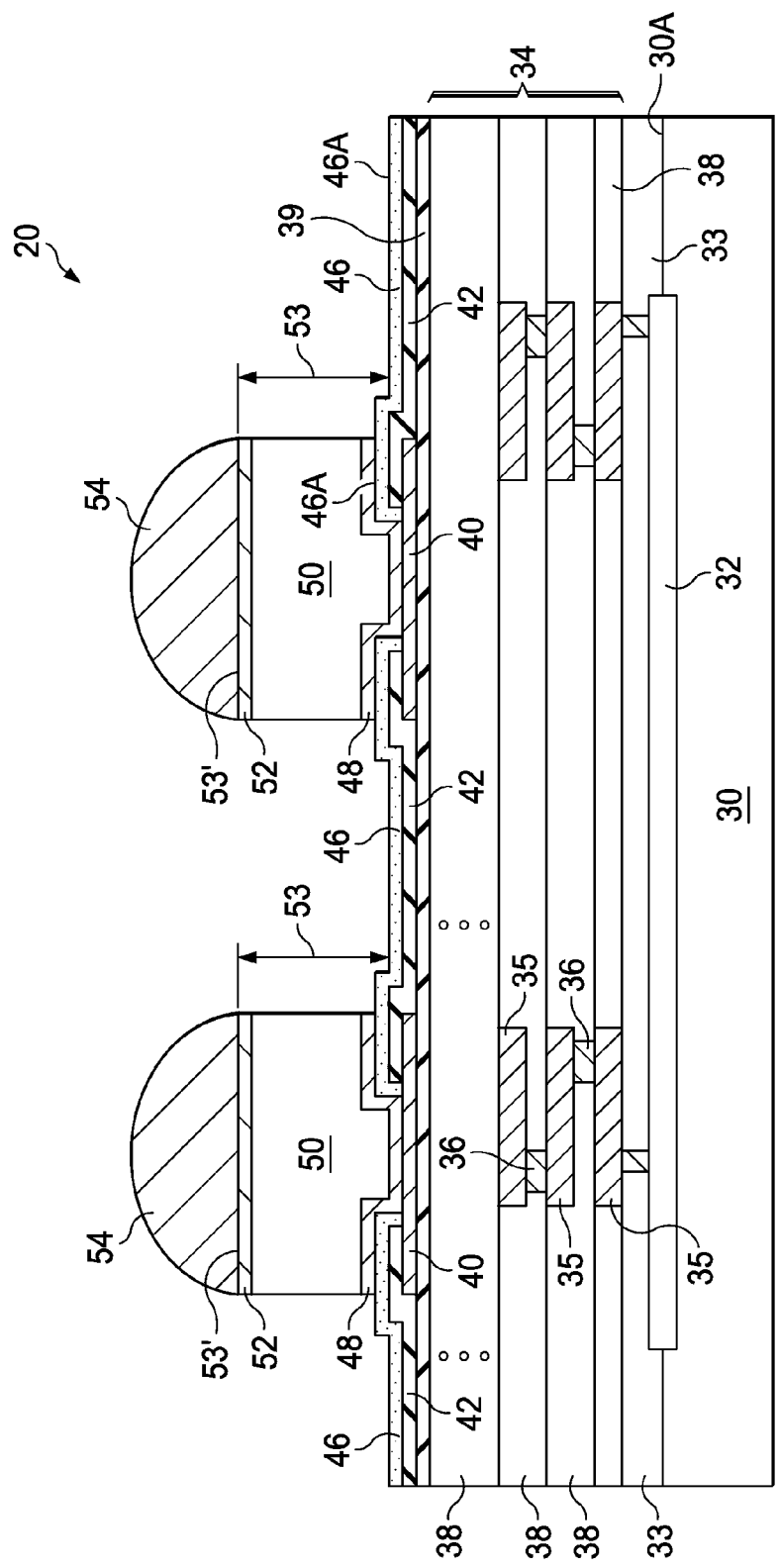
FIG. 1 illustrates a cross-sectional view of a device die including metal bumps in accordance with some exemplary embodiments.

FIG. 1 illustrates a cross-sectional view of package component 20 in accordance with exemplary embodiments. In some embodiments, package component 20 is a device die, and semiconductor substrate 30 may be a bulk silicon substrate or a silicon-on-insulator substrate. In alternative embodiments, other semiconductor materials including group III, group IV, and group V elements may also be included in semiconductor substrate 30. Integrated circuit 32 is formed at surface 30A of semiconductor substrate 30. Integrated circuit 32 may include Complementary Metal-Oxide-Semiconductor (CMOS) devices therein. In alternative embodiments, package component 20 is an interposer die, a package substrate, a package, or the like. In the embodiments wherein package component 20 is an interposer die, package component 20 does not include active devices such as transistors therein. Package component 20 may include passive devices such as resistors and capacitors, or free from passive devices in these embodiments.

Package component 20 may further include Inter-Layer Dielectric (ILD) 33 over semiconductor substrate 30, and interconnect structure 34 over ILD 33. Interconnect structure 34 includes metal lines 35 and vias 36 formed in dielectric layers 38. In some embodiments, dielectric layers 38 are formed of low-k dielectric materials. The dielectric constants (k values) of the low-k dielectric materials may be less than about 23.0, or less than about 2.5, for example. Metal lines 35 and vias 36 may be formed of copper, a copper alloy, or other metals.

Metal pads 40 are formed over metal layers 34, and may be electrically coupled to circuit 32 through metal lines 35 and vias 36 in metal layers 34. Metal pads 40 may be aluminum pads or aluminum-copper pads.

Passivation layer 42 is formed to cover the edge portions of metal pads 40. The central portions of metal pads 40 are exposed through (and under) the openings in passivation layer 42. Passivation layer 42 may be a single layer or a composite layer, and may be formed of a non-porous material. In some embodiments, passivation layer 42 is a composite layer comprising a silicon oxide layer (not shown), and a silicon nitride layer (not shown) over the silicon oxide layer. In alternative embodiments, passivation layer 42 comprises Un-doped Silicate Glass (USG), silicon oxynitride, and/or the like. There may be a single passivation layer or more than one passivation layer. For example, under metal pads 40, there may be passivation layer 39. In which embodiments, passivation layer 39 and passivation layer 42 are also referred to as passivation-1 (or pass1) 39 and passivation-2 (or pass2) 42 throughout the description.

Polymer layer 46 is formed over passivation layer 42 and covers passivation layer 42. Polymer layer 46 may comprise a polymer such as an epoxy, polyimide, benzocyclobutene (BCB), polybenzoxazole (PBO), and the like. Polymer layer 46 is patterned to form openings, through which metal pads 40 are exposed.

Under-Bump Metallurgies (UBM) 48 are formed over metal pads 40. Each of UBMs 48 may have a portion over polymer layer 46, and a portion extending into the opening in polymer layer 46 to contact the respective underlying metal pad 40. In some embodiments, each of UBMs 48 includes a titanium layer and a seed layer over the titanium layer, wherein the seed layer may be formed of copper or a copper alloy.

Metal pillars 50 are formed over UBMs 48, and are co-terminus with the respective underlying UBMs 48. For example, each of the edges of metal pillars 50 is aligned to a corresponding edge of one of UBMs 48. In some exemplary embodiments, metal pillars 50 are formed of a non-solder metal or metal alloy that does not melt at normal reflow temperatures (for example, about 200° C. to about 260° C.) of solders. In some exemplary embodiments, metal pillars 50 are formed of copper or a copper alloy.

In addition to metal pillars 50, there may be additional metal layers such as metal layer 52 formed on each of metal pillars 50, wherein metal layer 52 may include a nickel layer, a palladium layer, a gold layer, or multi-layers thereof. Throughout the description, metal pillars 50 and overlying metal layers 52 (if any) are in combination referred to as metal bumps 53. The top surfaces 53' of metal bumps 53 are higher than top surfaces 46A of polymer layer 46. Solder caps 54 may also be formed on metal bumps 53, wherein solder caps 54 may be formed of a Sn—Ag alloy, a Sn—Cu alloy, a Sn—Ag—Cu alloy, or the like, and may be lead-free or lead-containing.

Figure 2:
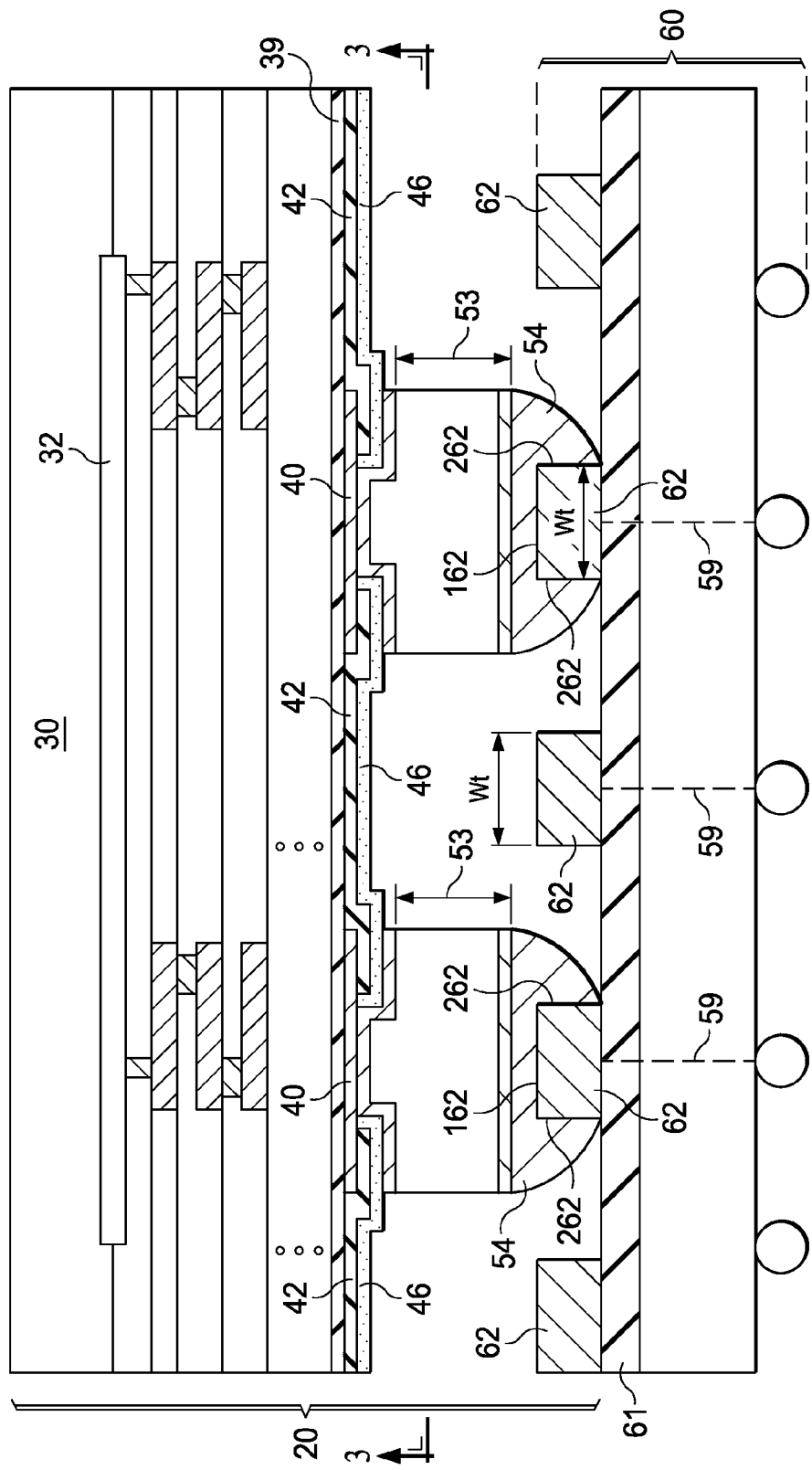
FIG. 2 illustrates a cross-sectional view of a device die bonded to a package substrate through Bump-on-Trace (BOT) bonding in accordance with some exemplary embodiments.

FIG. 2 illustrates the bonding of metal bumps 53 to metal traces 62 of package component 60 through a Bump-On-Trace (BOT) bonding scheme. In some embodiments, package component 60 is a package substrate, which may be a laminate substrate, a build-up package substrate, or the like. Package component 60 may include a plurality of dielectric layers, and metal lines and vias (represented by lines 59) embedded in the laminated dielectric layers. In alternative embodiments, package component 60 is a device die, a package, an interposer die, or the like. In the BOT bonding scheme, solder regions 54 are bonded to, and in contact with, the top surfaces 162 and sidewalls 262 of metal trace 62.

Metal traces 62 are disposed over dielectric layer 61. Metal traces 62 may be adhered to dielectric layer 61 through Van Der Waals force. The usable materials of metal traces 62 include, and are not limited to, pure copper, substantially pure copper (for example, with copper having an atomic percentage higher than about 99 percent), aluminum copper, tungsten, nickel, palladium, gold, and alloys of the above-mentioned materials. In some embodiments, as shown in FIG. 2, metal traces 62 are the topmost features of package component 60, with no dielectric layer covering metal traces 62. In alternative embodiments, there is a dielectric layer (not shown) covering most parts of metal traces 62 except those portions that are to be bonded to other components such as device die 20. The dielectric layer, if exist, may be a solder mask in some embodiments. Metal traces 62 may have a uniform width Wt.

Figure 3:
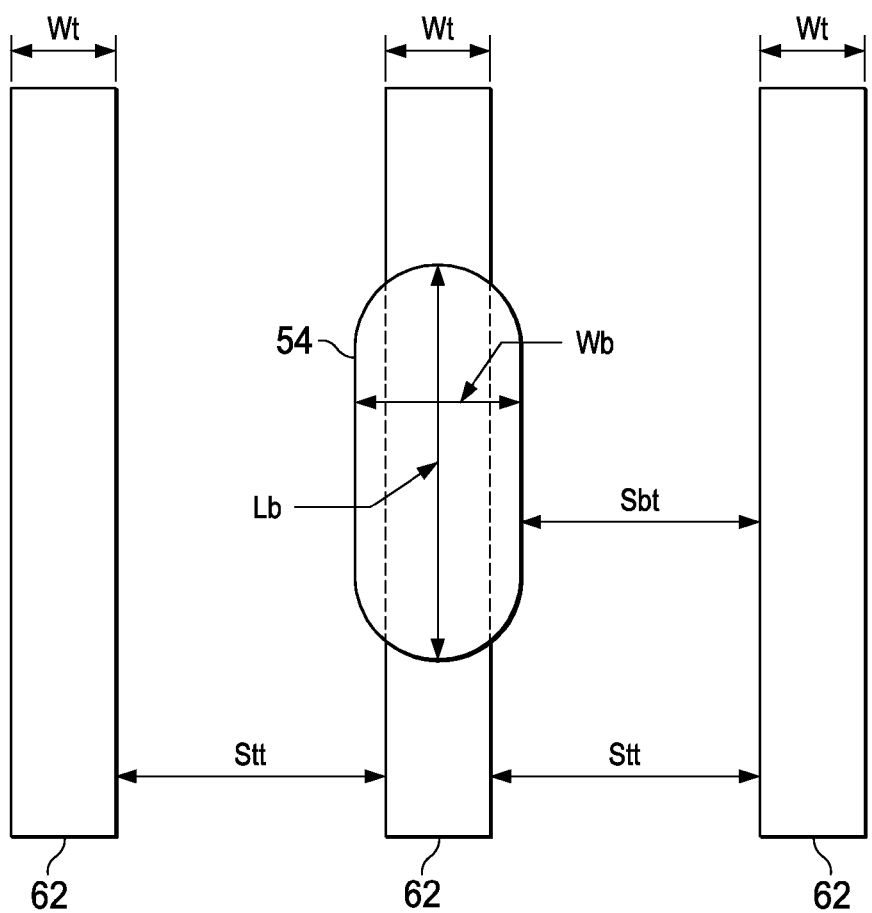
FIG. 3 illustrates a top view of a metal bump and metal traces in accordance with some exemplary embodiments.
Figure 6:
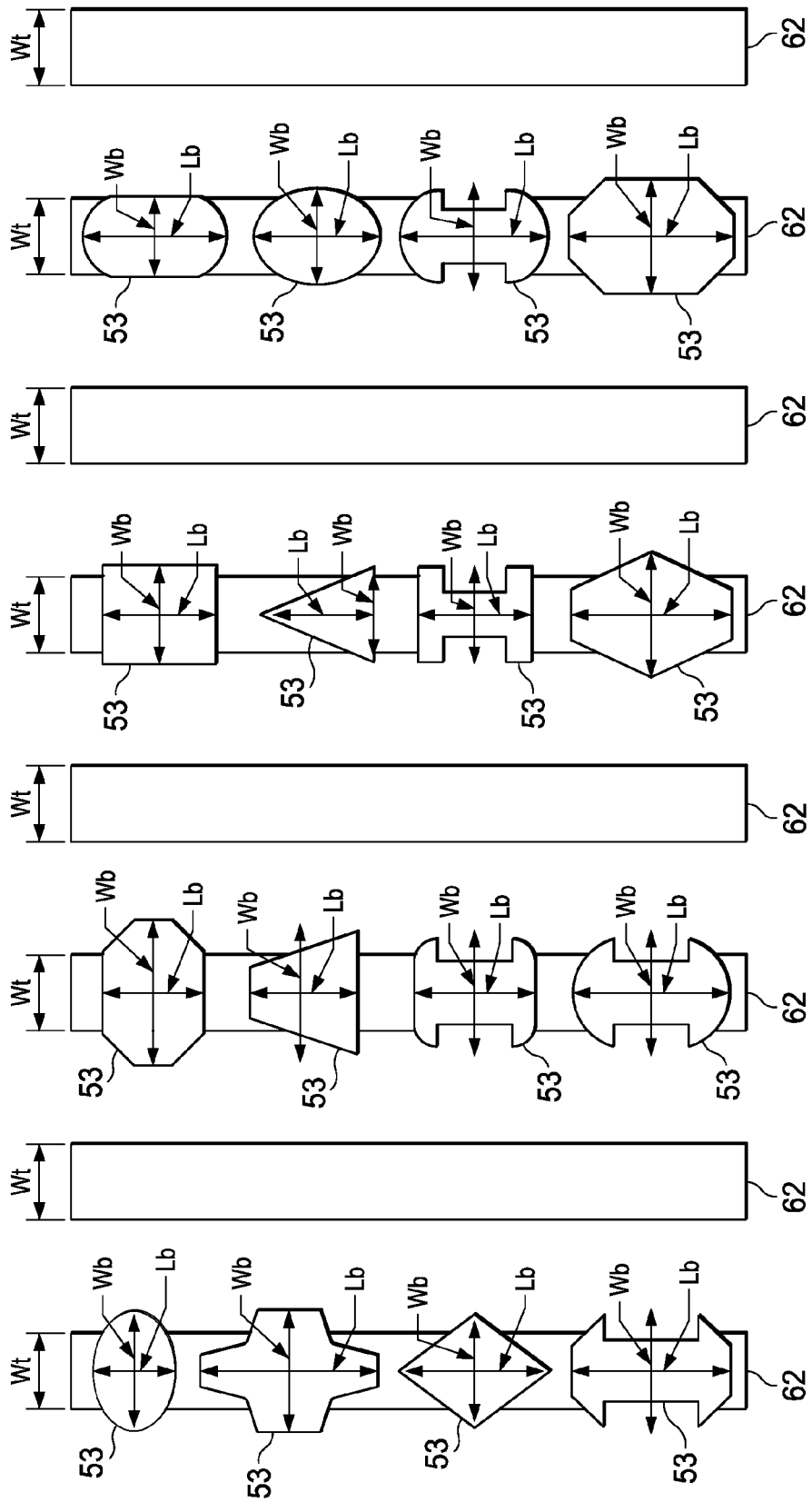
FIG. 6 illustrates the top views of various types of metal bumps.

FIG. 3 illustrates an exemplary top view of the package in FIG. 2, wherein the top view is obtained from the horizontal plane containing line 3-3 in FIG. 2. Metal traces 62 of package component 60 (FIG. 2) are also illustrated. In some embodiments, metal bumps 53 have elongated top-view shapes, and have lengthwise directions parallel to the lengthwise direction of metal traces 62, as illustrated in FIG. 3. For example, ratio Lb/Wb of metal bumps 53 is greater than 1, and may be equal to or greater than 2, wherein Lb is the maximum length of metal bump 53, with Lb measured in the lengthwise direction of metal traces 62. Width Wb is the maximum width of metal bump 53 measured in the direction perpendicular to the lengthwise direction of metal traces 62. In alternative embodiments, metal bumps 53 have other top-view shapes, with FIG. 6 illustrating some of the exemplary top views of metal bumps 53.

Experiment results obtained from sample BOT structures, which were manufactured and tested, indicate that the assembly yield of the BOT bonds are related to the volume of solder regions 54 (FIG. 2) and widths Wt of metal traces 62. The assembly yield is the ratio of the number of successful BOT bonds to the total number of BOT bonds. FIG. 4 illustrates the assembly yield of the bond structures as a function of the ratio (referred to as volume-to-width ratio hereinafter) of the volume of solder regions 54 to the widths Wt of the respective bonded metal traces 62. The assembly yield data were obtained from the metal traces with widths Wt equal to 20 µm and 24 µm. The X-axis values are the volume-to-width ratios. The respective assembly yield data are shown as Y-axis values. Experiment results indicated that when the spacing Stt (FIG. 3) between neighboring metal traces 62 is lower than about 100 µm, the BOT bonds to the metal traces that have 20 µm and 24 µm (and 17 µm, whose data are not shown) have the assembly yields similar to each other. The experiment results revealed that when the volume-to-width ratio is between about 1,100 µm² and about 1,300 µm², the yield is 1, which is 100 percent. When the volume-to-width ratios are smaller than about 1,100 µm and higher than about 1,300, unexpected results were observed. For example, when the volume-to-width ratios reduce from greater than 1,100 µm² to smaller than about 1,100 µm², there is an abrupt drop in the assembly yield occurring at around 1,100 µm². When the volume-to-width ratios increase from smaller than 1,300 µm² to greater than about 1,300 µm², there is also an abrupt drop in the assembly yield occurring at around 1,300 µm². Hence, in the embodiments of the present disclosure, to improve the assembly yield, the volume-to-width ratios of the BOT structures are selected to be between about 1,100 µm² and about 1,300 µm².

Experiment results obtained from sample BOT structures also indicate that the assembly yield of the BOT structures are related to ratio Wt/Wb, wherein Wt is the trace width of metal trace 62 (FIG. 3), and Wb is the bump width of metal bumps 53. Ratio Wt/Wb is referred to as a trace-width-to-bump-width ratio hereinafter. FIG. 5 illustrates the assembly yield of the BOT bonds as a function of trace-width-to-bump-width ratio Wt/Wb. The X-axis values are trace-width-to-bump-width ratios Wt/Wb. The respective assembly yield data are shown as Y-axis values. Experiment results indicate that trace-width-to-bump-width ratio of 0.73 corresponds to the assembly yield of 99.8 percent. When trace-width-to-bump-width ratios Wt/Wb are greater than 0.73 and less than about 1.0, the assembly yield reaches 1.0, which is 100 percent. When trace-width-to-bump-width ratios Wt/Wb drops below 0.73, unexpected results were observed. For example, when ratios Wt/Wb drop from greater than 0.73 to below 0.73, there is an abrupt drop in the assembly yield occurring at the point where ratio Wt/Wb is equal to 0.73. When ratios Wt/Wb increases to 1.0 or higher, the yield remains to be 1.0. However, since metal bumps 53 are narrower than the respective metal trace 62, it is difficult to keep solder regions 54 on the sidewalls of metal trace 62. Hence, in the embodiments of the present disclosure, to improve the assembly yield, the tracewidth-to-bump-width ratios Wt/Wb of the BOT bonds are selected to be in the range between 0.73 and about 1.0 (including 1.0).

From FIG. 2, it is observed that when trace-width-to-bump-width ratio Wt/Wb is equal to or greater than 1, metal bumps 53 do not extend beyond the edges of the respective underlying metal traces 62. As a result, the likelihood of solder regions 54 extending toward neighboring metal traces 62 is also limited, resulting in a maximized process window in which no solder bridging occurs.

FIG. 6 illustrates the top views of a plurality of exemplary metal bumps 53. For the convenience of drawing, each of metal traces 62 is shown as being bonded with a plurality of metal bumps 53 that have different top-view shapes. In reality, the metal bumps 53 bonded to the metal trace 62 of the same die may have the same top-view shape, although the top-view shapes of the metal bumps bonded to the metal traces of the same die may also have different top-view shapes. Hence, each of the metal bumps 53 may be used on one die, instead of being mixed to bond to the same die. The various metal bumps 53 shown in FIG. 6 are also in the scope of the present disclosure.

The embodiments of the present disclosure have some advantageous features. Through selecting the trace-width-to-bump-width ratio and the volume-to-width ratios for BOT bonds, the assembly yield of the BOT bonds reach 100 percent. The improvement in the assembly yield does not requirement added process steps.

In accordance with some embodiments, a package includes first package component, which further includes a first metal trace at a surface of the first package component, with the first metal trace having a trace width measured in a direction perpendicular to a lengthwise direction of the first metal trace. The first package component further includes a second metal trace at the surface of the first package component. The first metal trace and the second metal trace are parallel to each other. A second package component is overlying the first package component, wherein the second package component includes a metal bump. A solder region bonds the metal bump to the first metal trace, wherein the solder region contacts a top surface and sidewalls of the first portion of the first metal trace. A ratio of a volume of the solder region to the trace width is between about 1,100 μm² and about 1,300 μm².

In accordance with other embodiments, a package includes a first package component and a second package component. The first package component includes a first metal trace at a surface of the first package component. The first metal trace has a trace width, with the trace width measured in a direction perpendicular to a lengthwise direction of the first metal trace. The first package component further includes a second metal trace at the surface of the first package component, wherein the first metal trace and the second metal trace are parallel to each other. The second package component is overlying the first package component, wherein the second package component has a metal bump overlapping a portion of the first metal trace, with the metal bump having a bump width measured in the direction perpendicular to the lengthwise direction of the first metal trace. A ratio of the trace width to the bump width is in the range between 0.73 and about 1.0. A solder region bonds the metal bump to the first metal trace, wherein the solder region contacts a top surface and sidewalls of a first portion of the first metal trace.

In accordance with yet other embodiments, a package includes a first package component and a second package component. The first package component includes a first metal trace at a surface, wherein the first metal trace has a trace width measured in a direction perpendicular to a lengthwise direction of the first metal trace. The first metal trace includes a first portion, and second portions physically connected to opposite ends of the first portion. The first package component further includes a second metal trace at the surface of the first package component, wherein the first metal trace and the second metal trace are parallel to each other, and wherein the first metal trace and second metal trace have a uniform width. The second package component is overlying the first package component, wherein the second package component includes a metal bump. A solder region bonds the metal bump to the first metal trace. The solder region contacts a top surface and sidewalls of the first portion of the first metal trace, with top surfaces and sidewalls of the second portions not in contact with the solder region. A ratio of a volume of the solder region to the trace width is between about 1,100 μm² and about 1,300 μm².

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a first package component comprising:
      a first metal trace at a surface of the first package component, wherein the first metal trace has a trace width, with the trace width being measured in a direction perpendicular to a lengthwise direction of the first metal trace; and
      a second metal trace at the surface of the first package component, wherein the first metal trace and the second metal trace are parallel to each other;
   a second package component over the first package component, wherein the second package component comprises a metal bump; and
   a solder region bonding the metal bump to the first metal trace, wherein the solder region contacts a top surface and sidewalls of a first portion of the first metal trace, and wherein a ratio of a volume of the solder region to the trace width is between about 1,100 μm² and about 1,300 μm².

2. The package of claim 1, wherein the first metal trace and the second metal trace have a spacing smaller than about 100 μm, with no additional metal traces disposed between the first metal trace and the second metal trace.

3. The package of claim 1, wherein the metal bump has a bump width measured in the direction perpendicular to the lengthwise direction of the first metal trace, and wherein a ratio of the trace width to the bump width is in a range between 0.73 and about 1.0.

4. The package of claim 1, wherein the metal bump has an elongated top-view shape, and wherein the metal bump has a bump length measured in the direction parallel to the lengthwise direction of the first metal trace, and a bump width measured in the direction perpendicular to the lengthwise direction of the first metal trace, with a ratio of the bump length to the bump width being equal to or greater than about 2.

5. The package of claim 1, wherein the first metal trace further comprises second portions physically connected to opposite ends of the first portion, wherein no solder is in contact with the second portions, and wherein the first portion and the second portions have a same width.

6. The package of claim 5, wherein the first portion and the second portions of the first metal trace are not covered by any dielectric layer that is comprised by the first package component.

7. The package of claim 1, wherein the first package component comprises a device die, and the second package component comprises a package substrate.

8. A package comprising:
 a first package component comprising:
  a first metal trace at a surface of the first package component, wherein the first metal trace has a trace width, with the trace width measured in a direction perpendicular to a lengthwise direction of the first metal trace;
  a second metal trace at the surface of the first package component, wherein the first metal trace and the second metal trace are parallel to each other;
 a second package component over the first package component, wherein the second package component comprises a metal bump overlapping a portion of the first metal trace, with the metal bump having a bump width measured in the direction perpendicular to the lengthwise direction of the first metal trace, and wherein a ratio of the trace width to the bump width is in a range between 0.73 and about 1.0; and
 a solder region bonding the metal bump to the first metal trace, wherein the solder region contacts a top surface and sidewalls of a first portion of the first metal trace, and a ratio of a volume of the solder region to the trace width is between about 1,100 $\mu m^2$ and about 1,300 $\mu m^2$.

9. The package of claim 8, wherein the first metal trace and the second metal traces comprise copper.

10. The package of claim 8, wherein the first metal trace and the second metal trace have a spacing smaller than about 100 μm, with no additional metal traces disposed between the first metal trace and the second metal trace.

11. The package of claim 8, wherein the metal bump has an elongated top-view shape, and wherein the metal bump has a bump length measured in the direction parallel to the lengthwise direction of the first metal trace, with a ratio of the bump length to the bump width being equal to or greater than 2.

12. The package of claim 8, wherein the first metal trace further comprises second portions physically connected to opposite ends of the first portion, wherein no solder is in contact with the second portions, and wherein the first portion and the second portions have a uniform width.

13. The package of claim 12, wherein the ratio of the trace width to the bump width is greater than 0.73.

14. The package of claim 8, wherein the first package component comprises a device die, and the second package component comprises a package substrate.

15. A package comprising:
 a first package component comprising:
  a first metal trace at a surface of the first package component, wherein the first metal trace has a trace width, with the trace width measured in a direction perpendicular to a lengthwise direction of the first metal trace, and wherein the first metal trace comprises:
   a first portion; and
   second portions physically connected to opposite ends of the first portion;
  a second metal trace at the surface of the first package component, wherein the first metal trace and the second metal trace are parallel to each other, and wherein the first metal trace and second metal trace have a uniform width;
 a second package component over the first package component, wherein the second package component comprises a metal bump; and
 a solder region bonding the metal bump to the first metal trace, wherein the solder region contacts a top surface and sidewalls of the first portion of the first metal trace, with top surfaces and sidewalls of the second portions not in contact with the solder region, and wherein a ratio of a volume of the solder region to the trace width is between about 1,100 $\mu m^2$ and about 1,300 $\mu m^2$.

16. The package of claim 15, wherein the first metal trace and the second metal trace have a spacing smaller than about 100 μm, with no additional metal traces disposed between the first metal trace and the second metal trace.

17. The package of claim 15, wherein the metal bump has a bump width measured in the direction perpendicular to the lengthwise direction of the first metal trace, and wherein a ratio of the trace width to the bump width is in a range between 0.73 and about 1.0.

18. The package of claim 15, wherein the metal bump has an elongated top-view shape, and wherein the metal bump has a bump length measured in the direction parallel to the lengthwise direction of the first metal trace, and a bump width measured in the direction perpendicular to the lengthwise direction of the first metal trace, with a ratio of the bump length to the bump width being equal to or greater than 2.

19. The package of claim 15, wherein the second portions of the metal trace is not covered by any dielectric layer comprised in the first package component.

* * * * *